(12) United States Patent
Guo et al.

(10) Patent No.: US 10,864,556 B2
(45) Date of Patent: Dec. 15, 2020

(54) TANK FOR SUBSTRATE CLEANING, TANK HEATING APPARATUS, TANK HEATING METHOD, AND SUBSTRATE CLEANING APPARATUS

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Zhiguang Guo, Beijing (CN); Jinxia Hu, Beijing (CN); Dahu Tang, Beijing (CN); Xin Cai, Beijing (CN); Jianfeng Liu, Beijing (CN); Jing Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 353 days.

(21) Appl. No.: 15/724,926

(22) Filed: Oct. 4, 2017

(65) Prior Publication Data
US 2018/0193885 A1 Jul. 12, 2018

(30) Foreign Application Priority Data

Jan. 9, 2017 (CN) .......................... 2017 1 0014406

(51) Int. Cl.
*B08B 3/10* (2006.01)
*F28D 21/00* (2006.01)
*H01L 21/67* (2006.01)

(52) U.S. Cl.
CPC .............. *B08B 3/10* (2013.01); *F28D 21/001* (2013.01); *H01L 21/67051* (2013.01); *B08B 2203/007* (2013.01)

(58) Field of Classification Search
None
See application file for complete search history.

(56) References Cited

U.S. PATENT DOCUMENTS 4,506,140 A * 3/1985 Armstrong ............... H05B 3/82
219/523
5,544,701 A * 8/1996 Elder ...................... E03C 1/041
126/261

(Continued)

FOREIGN PATENT DOCUMENTS

CN 102538218 A 7/2012
CN 103264022 A 8/2013

(Continued)

OTHER PUBLICATIONS

Second Office Action for Chinese Application No. 201710014406.9, dated Apr. 10, 9 Pages.

(Continued)

*Primary Examiner* — Nicole Blan
(74) *Attorney, Agent, or Firm* — Brooks Kushman P C.

(57) ABSTRACT

A tank for substrate cleaning, a tank heating apparatus, a tank heating method and a substrate cleaning apparatus are provided. The substrate cleaning tank includes a tank body, a hot waste gas recycle tube, a heater and a heat exchange tube. The hot waste gas recycle tube is used to receive a hot waste gas in a hot waste gas discharge tube of a production line, the heater and the heat exchange tube are used to heat a fluid in the tank body, and the heat exchange tube is communicated with the hot waste gas recycle tube. The hot waste gas is effectively utilized, the power consumption is (Continued)

reduced, the production cost is saved, and the discharge of the hot waste gas is reduced.

13 Claims, 2 Drawing Sheets

(56) References Cited

U.S. PATENT DOCUMENTS

| | | | | |
|---|---|---|---|---|
| 5,705,055 | A | * | 1/1998 | Holloway, Jr. .... B01D 17/0208 210/115 |
| 8,459,984 | B2 | * | 6/2013 | Duesel, Jr. ................ F23G 7/08 431/202 |
| 2010/0192845 | A1 | * | 8/2010 | Horn ................... F16L 55/1645 118/105 |
| 2011/0131752 | A1 | * | 6/2011 | Place ...................... E01H 1/103 15/320 |
| 2011/0131961 | A1 | * | 6/2011 | Lee ........................ F01M 5/001 60/320 |

FOREIGN PATENT DOCUMENTS

| | | |
|---|---|---|
| CN | 204544877 U | 8/2015 |
| CN | 105258337 A | 1/2016 |
| CN | 105604748 A | 5/2016 |
| CN | 205269355 U | 6/2016 |
| JP | 2007048983 A | 2/2007 |

OTHER PUBLICATIONS

First Office Action for Chinese Application No. 201710014406.9, dated Jul. 2, 2018, 8 Pages.

\* cited by examiner

TANK FOR SUBSTRATE CLEANING, TANK HEATING APPARATUS, TANK HEATING METHOD, AND SUBSTRATE CLEANING APPARATUS

CROSS-REFERENCE TO RELATED APPLICATION

The present application claims a priority to Chinese Patent Application No. 201710014406.9 filed on Jan. 9, 2017, which is incorporated herein by reference in its entirety.

TECHNICAL FIELD

The present disclosure relates to the field of technologies for cleaning display devices, and in particular, the present disclosure relates to a tank for substrate cleaning, a tank heating apparatus, a tank heating method and a substrate cleaning apparatus.

BACKGROUND

A large number of high temperature heating processing equipment and some heat-consuming auxiliary equipment are used in a production line for liquid crystal display devices, which may produce a lot of hot waste gases that usually cannot be recycled. For instance, in a One Drop Fill (ODF) production line, an ODF device After Friction Curing Oven (ARCO) is mainly used to sufficiently dry a cleaned substrate, an initial operating temperature of the ARCO is 150° C., a temperature of a hot waste gas exhausted from the ARCO is higher than 150° C.; moreover, hot waste gases exhausted from a Seal Oven and an Aging Oven are higher than 120° C. At current, these hot waste gases are directly discharged into a power pipeline without recycling, which causes great losses of heat energies.

Meanwhile, when cleaning the substrate in the ODF production line, effective cleaning can only be implemented by heating the fluid in the tank up to a certain temperature (for instance, 40° C.). At current, an electric heater is typically adopted to heat the tank, and the production line for display devices runs for 24 hours per day; therefore, lots of electricity is consumed every day.

SUMMARY

The present disclosure provides a tank for substrate cleaning, a tank heating apparatus, a tank heating method and a substrate cleaning apparatus.

It is provided a tank for substrate cleaning, applied to a production line, in the present disclosure. The tank includes a tank body, a hot waste gas recycle tube, a heater, a heat exchange tube and an exhaust tube. The hot waste gas recycle tube is used to receive a hot waste gas in a hot waste gas discharge tube of the production line, the heater and the heat exchange tube are used to heat a fluid in the tank body, one end of the heat exchange tube is communicated with the hot waste gas recycle tube, and the other end of the heat exchange tube is communicated with the exhaust tube.

Optionally, the heater and the heat exchange tube are arranged inside the tank body.

Optionally, one end of the hot waste gas recycle tube is communicated with the heat exchange tube, and the other end of the hot waste gas recycle tube is communicated with the hot waste gas discharge tube.

Optionally, the tank body includes an inner shell and an outer shell, a thermal insulation cavity is formed between the inner shell and the outer shell, and the thermal insulation cavity is communicated with the hot waste gas recycle tube.

Optionally, the inner shell is made of a stainless steel material.

Optionally, the outer shell is made of a PVC material.

Optionally, a top of the outer shell is provided with a liquid inlet tube communicated with the thermal insulation cavity, and a bottom of the outer shell is provided with a liquid discharge tube communicated with the thermal insulation cavity.

Optionally, the hot waste gas recycle tube is a heat-insulated pipeline.

Optionally, the heat exchange tube is any one of an immerged coiler, a U-tube, and a coil.

Optionally, the heat exchange tube is made of a stainless steel.

Optionally, the heater includes a sleeve and a heating element inserted in the sleeve, and the sleeve is provided with multiple radiating fins.

Optionally, the hot waste gas recycle tube is provided with a fan.

It is further provided a tank heating apparatus in the present disclosure, and the tank heating apparatus includes: any of the substrate cleaning tank as described above; a temperature sensor arranged in the tank body and used to detect a temperature of the fluid in the tank body; and a control device electrically connected with the temperature sensor and used to control the heater and/or the heat exchange tube to heat in the case that the temperature of the fluid in the tank body is lower than a set temperature, and control the heater and the heat exchange tube to stop heating in the case that the temperature of the fluid in the tank body is not lower than the set temperature.

It is further provided a tank heating method used to heat any of the tank for substrate cleaning as described above, including the following steps of: detecting a temperature of the fluid in the tank body; determining whether the temperature of the fluid in the tank body is lower than a set temperature, controlling the heater and/or the heat exchange tube to heat in the case that the temperature of the fluid is lower than the set temperature; and controlling the heater and the heat exchange tube to stop heating in the case that the temperature of the fluid is not lower than the set temperature.

It is further provided a substrate cleaning apparatus in the present disclosure, the substrate cleaning apparatus includes: any of the tank for substrate cleaning as described above; a pump connected with the tank and used to pump a substrate cleaning fluid in the tank; and multiple nozzles connected with the pump and used to clean a substrate.

DETAILED DESCRIPTION OF THE EMBODIMENTS

A substrate cleaning tank, a tank heating apparatus and a substrate cleaning apparatus provided in the present disclosure will be described hereinafter in detail based on specific embodiments in conjunction with drawings, but the present disclosure is not limited to these embodiments.

Figure 1:
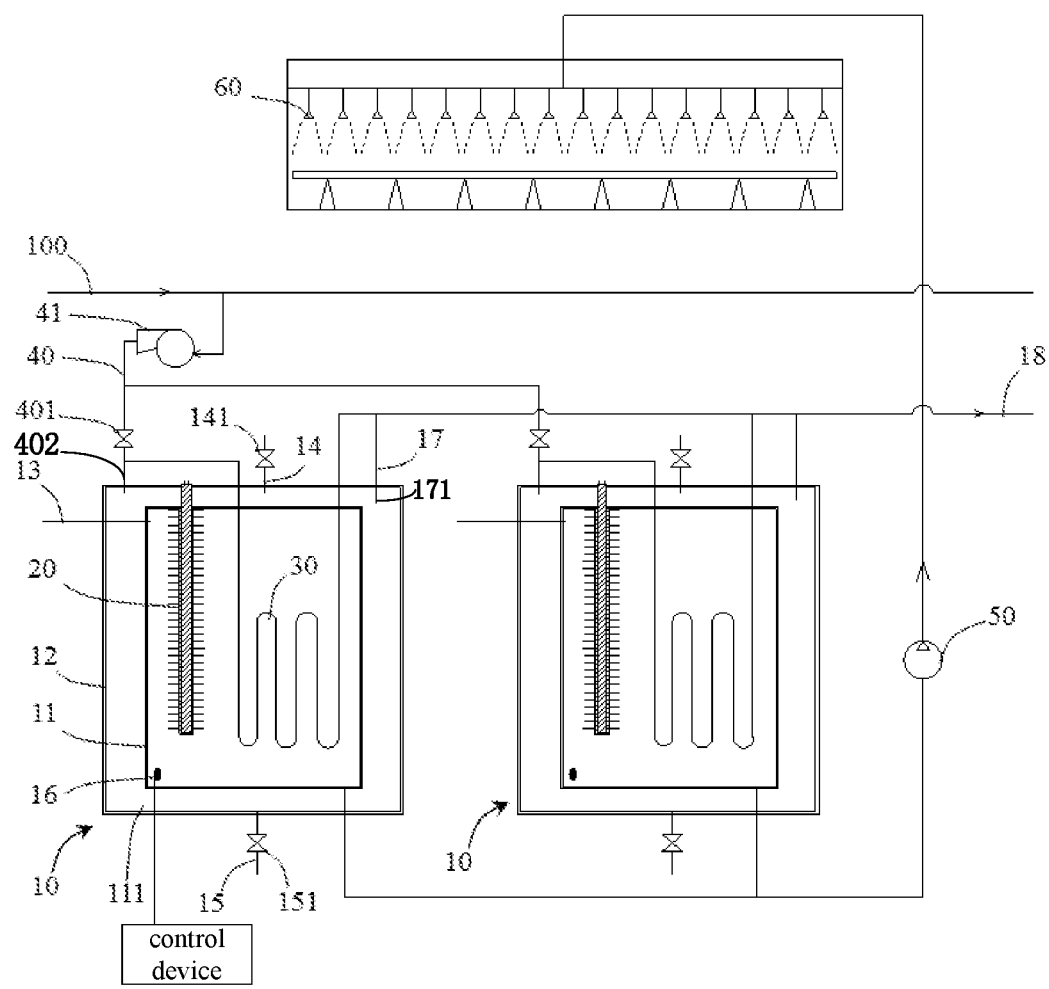
FIG. 1 is a schematic diagram of a substrate cleaning apparatus according to some embodiments of the present disclosure.

Referring to FIG. 1, it is provided a tank for substrate cleaning in some embodiments of the present disclosure, which includes a tank body 10, as well as a heater 20 and a heat exchange tube 30 that are arranged in the tank body 10 and used to heat a fluid in the tank body 10. The heat exchange tube 30 is communicated with a hot waste gas discharge tube 100 of a production line for liquid crystal display devices through a hot waste gas recycle tube 40, and the hot waste gas recycle tube 40 is used to receive a hot waste gas in the hot waste gas discharge tube of the production line for liquid crystal display devices. By arranging the heat exchange tube 30 in the tank body 10, the hot waste gas in the hot waste gas discharge tube 100 of the production line for liquid crystal display devices is guided into the heat exchange tube 30 through the hot waste gas recycle tube 40, to exchange heat with the fluid in the tank body 10, thereby heating the fluid. After completing the heat exchange, the hot waste gas that has flowed through the heat exchange tube 30 is discharged through an exhaust tube 18 communicated with the heat exchange tube 30. An inlet of the heat exchange tube 30 is communicated with the hot waste gas recycle tube 40, and an outlet of the heat exchange tube 30 is communicated with the exhaust tube 18. The heat exchange tube 30 may be in structural forms of an immerged coiler, a U-tube, a coil, etc. The heat exchange tube 30 is formed by a stainless steel tube in a winding manner.

The heater 20 and the heat exchange tube 30 may be arranged in the tank body 10 so as to heat the fluid directly. Of course, in other embodiments, the heater and the heat exchange tube may also be arranged outside the tank body 10 to heat the fluid in the tank body 10; for instance, an infrared heater may be arranged outside the tank body 10 and the fluid may be heated by radiation, a coil may be adopted as the heat exchange tube and arranged outside the tank body 10. If the heater 20 and the heat exchange tube 30 are arranged in the tank body 10, the heating is fast and the heating efficiency is high. Hence, optionally, for the tank body 10 of the tank for substrate cleaning according to the embodiments of the present disclosure, the heater 20 and the heat exchange tube 30 are arranged in the tank body 10.

Figure 2:
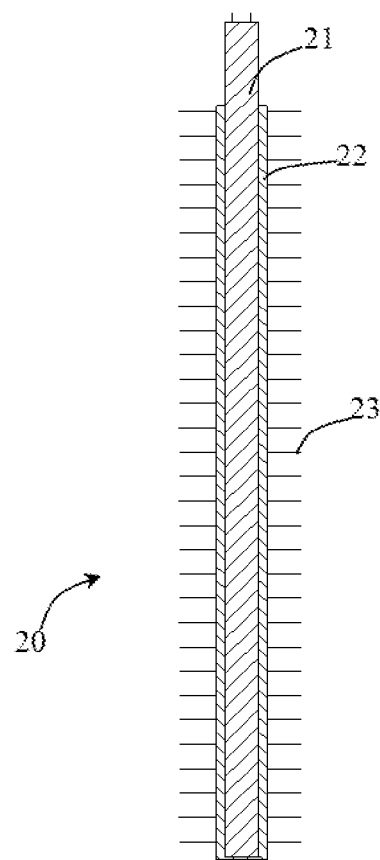
FIG. 2 is an enlarged schematic diagram of a heater in the substrate cleaning apparatus in FIG. 1.

An electric heater with high heating efficiency is provided in some embodiments of the present disclosure. As shown in FIG. 2, a heater 20 according to some embodiments of the present disclosure includes a sleeve 22 and a heating element 21 inserted in the sleeve 22, and the sleeve 22 is provided with multiple radiating fins 23. An electric heating manner is adopted for the heating element 21, and heat generated by the heating element 21 is conducted to heat the fluid in the tank body 10 through the radiating fins 23. The radiating fins 23 directly contact with the fluid, which increases the heat exchanging area, increases the heating rate, improves the heating efficiency, and enables the fluid in the tank body 10 to reach a process-required temperature quickly.

Further referring to FIG. 1, the tank body of the tank for substrate cleaning according to the embodiments of the present disclosure includes an inner shell 11 and an outer shell 12. A thermal insulation cavity 111 is formed between the inner shell 11 and the outer shell 12, and the thermal insulation cavity 111 is communicated with the hot waste gas recycle tube 40. The hot waste gas in the hot waste gas discharge tube 100 enters the thermal insulation cavity 111 between the inner shell 11 and the outer shell 12 through the hot waste gas recycle tube 40, so that the heat losses of the fluid in the tank body 10 can be avoided. The outer shell 12 is provided with a gas inlet interface 402 which is communicated with the hot waste gas recycle tube 40 and used to introduce the hot waste gas to the thermal insulation cavity 111. The outer shell 12 is further provided with an exhaust 171 which is communicated with the exhaust tube 18 through a connecting tube 17 and used to discharge the hot waste gas in the thermal insulation cavity 111.

The inner shell 11 is made of a stainless steel material which has high intensity and can prevent deformation under a high temperature state. Meanwhile, the heat of the gas in the thermal insulation cavity 111 can be conducted to the fluid in the tank body 10 through the stainless steel inner shell 11, thereby achieving functions of thermal insulation and auxiliary heating. The inner shell 11 has advantages of good thermal conductivity, anti-corrosion, high intensity, and the like.

The outer shell 12 is made of a PVC material which conducts heat slowly and therefore prevents heat loss in the thermal insulation cavity 111; hence, the outer shell 12 is beneficial to thermal insulation. The PVC material may optionally be a hard PVC material to ensure the intensity of the outer shell 12.

In order to prevent heat loss of the hot waste gas flowed in the hot waste gas recycle tube 40, a heat-insulated pipeline is adopted as the hot waste gas recycle tube 40. The hot waste gas recycle tube 40 is provided with a control valve 401 which is used to control whether to convey hot waste gas into the heat exchange tube 30, thus controlling whether to heat the fluid in the tank body 10 using the heat exchange tube 30. Meanwhile, the control valve 401 can also control whether to input the hot waste gas into the thermal insulation cavity 111. In other embodiments, independent control valves can be arranged respectively to control whether to input hot waste gas into the thermal insulation cavity and whether to input hot waste gas into the heat exchange tube.

The hot waste gas recycle tube 40 is provided with a fan 41 which is used to enhance a pressure of the hot waste gas in the hot waste gas recycle tube 40, thereby ensuring the effective conveying of the hot waste gas and making full use of the hot waste gas in the hot waste gas discharge tube 100.

Because the thermal insulation cavity 111 is full of the hot waste gas; after a period of use, some impurities contained in the hot waste gas may be deposited at an inner wall of the outer shell 12 and at an outer wall of the inner shell 11; in order to remove the deposits in the thermal insulation cavity 111, the thermal insulation cavity 111 needs to be cleaned and maintained. The top of the outer shell 12 is provided with a liquid inlet tube 14 communicated with the thermal insulation cavity 111, and the bottom of the outer shell is provided with a liquid discharge tube 15 communicated with the thermal insulation cavity 111. The liquid inlet tube 14 is used to add a detergent into the thermal insulation cavity 111, and the detergent may be iso-propanol, acetone, etc. The liquid discharge tube 15 is used to discharge the detergent after cleaning. The liquid inlet tube 14 and the liquid discharge tube 15 are respectively provided with valves 141 and 151. The valves 141 and 151 are under a normally closed state when the tank runs normally, and are open according to actual needs when the thermal insulation cavity 111 needs to be cleaned and maintained.

The tank further includes a fluid inlet tube 13 communicated with the interior of the tank body 10 and used to inject a substrate cleaning fluid into the tank body 10. The fluid herein may be water or water added with a liquid medicine for cleaning. The types of the fluid are determined according to process requirements on cleaning the substrate. It should be noted that the above-mentioned fluid inlet tube 13 penetrates through the inner shell 11 and the outer shell 12 via through holes in the inner shell 11 and the outer shell 12 so as to inject the substrate cleaning fluid into the tank body. The fluid inlet tube 13 is tightly matched with the through holes in the inner shell 11 and the outer shell 12 so as to guarantee that the fluid inside the tank body and the hot waste gas and liquid in the thermal insulation cavity may not leak out via the through holes. Similarly, the liquid inlet tube 14 and the liquid discharge tube 15 are inserted in the tank via through holes in the outer shell 12. The liquid inlet tube 14 and the liquid discharge tube 15 are tightly matched with the through holes so as to guarantee that the hot waste gas and liquid in the thermal insulation cavity may not leak out via the through holes. Similarly, in the case that the heat exchange tube is arranged inside the tank body, both the inlet and the outlet of the heat exchange tube stretch out of the tank body via through holes in the inner shell 11 and the outer shell 12. The heat exchange tube is tightly matched with the through holes so as to guarantee that the fluid inside the tank body and the hot waste gas and liquid in the thermal insulation cavity may not leak out via the through holes.

A tank heating apparatus is provided according to some embodiments of the present disclosure. As shown in FIG. 1, the tank heating apparatus includes the above-mentioned substrate cleaning tank, and further includes: a temperature sensor 16 arranged in the tank body 10 and used to detect temperature information of a fluid in the tank body 10; and a control device 19 electrically connected with the temperature sensor 16 and used to control the heater 20 and/or the heat exchange tube 30 to heat in the case that a temperature of the fluid in the tank body 10 is lower than a set temperature, and control the heater 20 and the heat exchange tube 30 to stop heating in the case that the temperature of the fluid in the tank body 10 is not lower than the set temperature.

In the embodiments of the present disclosure, the control device is adopted to automatically control the temperature of the fluid, and the heat exchange tube 30 is controlled to start heating and stop heating through the control valve 401. The control function of the control device can be implemented either by hardware or by software. The set temperature is determined according to process requirements on cleaning the substrate. Usually, the set temperature ranges from 40° C. to 100° C. The set temperature may be any temperature between 40° C. and 100° C., for instance, 40° C., 45° C., 50° C., 60° C., 70° C., 80° C., 90° C. or 100° C., and the like.

A tank heating method is provided in some embodiments of the present disclosure, which includes the steps of: introducing the hot waste gas in the production line for liquid crystal display devices into the heat exchange tube 30 to heat the fluid in the tank body 10 while using the heater 20 to heat the fluid in the tank body 10, detecting a temperature of the fluid in the tank body 10 through the temperature sensor 16, determining whether the temperature of the fluid in the tank body 10 is lower than a set temperature, controlling the heater 20 and/or the heat exchange tube 30 to heat if the temperature of the fluid is lower than the set temperature; and controlling the heater 20 and the heat exchange tube 30 to stop heating if the temperature of the fluid is not lower than the set temperature.

A substrate cleaning apparatus is provided in some embodiments of the present disclosure, including the above-mentioned substrate cleaning tank; a pump 50 connected with the tank, which is used to pump a substrate cleaning fluid in the tank; and multiple nozzles 60 connected with the pump 50 and used to clean the substrate. As an example, FIG. 1 illustrates two tanks, and the skilled in the art can understand that one or two or more than two of the tanks can be arranged, and the number of the tanks is determined according to actual requirements. Optionally, the pump 50 is a high-pressure pump, so that the speed of the fluid ejected from the nozzles 60 is higher and the cleaning effect is better.

Those described above are only exemplary embodiments of the present disclosure, but are not intended to limit the present disclosure. The scope of protection of the present disclosure is defined by the claims. The skilled in the art can make various modifications or equivalent substitutions without departing from the essence and scope of protection of the disclosure, and those modifications or equivalent substitutions shall all fall in the scope of protection of the present disclosure.

What is claimed is:

1. A tank for substrate cleaning, applied to a production line, wherein the tank for substrate cleaning comprises: a tank body, a hot waste gas recycle tube, a heater, a heat exchange tube and an exhaust tube, wherein the hot waste gas recycle tube is configured to receive a hot waste gas in a hot waste gas discharge tube of the production line, the heater and the heat exchange tube are configured to heat a fluid in the tank body, one end of the heat exchange tube is communicated with the hot waste gas recycle tube, and the other end of the heat exchange tube is communicated with the exhaust tube;

wherein the tank body comprises an inner shell and an outer shell, a thermal insulation cavity is formed between the inner shell and the outer shell, and the thermal insulation cavity is communicated with the hot waste gas recycle tube;

wherein a top of the outer shell is provided with a liquid inlet tube communicated with the thermal insulation cavity, and a bottom of the outer shell is provided with a liquid discharge tube communicated with the thermal insulation cavity;

wherein the outer shell is provided with a gas inlet interface which is communicated with the hot waste gas recycle tube and used to introduce the hot waste gas to the thermal insulation cavity; the outer shell is further provided with an exhaust interface which is communicated with the exhaust tube through a connecting tube and used to discharge the hot waste gas in the thermal insulation cavity;

wherein the hot waste gas recycle tube is a heat-insulated pipeline; the hot waste gas recycle tube is provided with a control valve which is configured to control whether to convey hot waste gas into the heat exchange tube; and wherein the liquid inlet tube and the liquid discharge tube are respectively provided with valves.

2. The tank for substrate cleaning according to claim 1, wherein the heater and the heat exchange tube are arranged inside the tank body.

3. The tank for substrate cleaning according to claim 1, wherein one end of the hot waste gas recycle tube is communicated with the heat exchange tube, and the other end of the hot waste gas recycle tube is communicated with the hot waste gas discharge tube.

4. The tank for substrate cleaning according to claim 1, wherein the inner shell is made of a stainless steel material.

5. The tank for substrate cleaning according to claim 1, wherein the outer shell is made of a polyvinyl chloride material.

6. The tank for substrate cleaning according to claim 1, wherein the hot waste gas recycle tube is a heat-insulated pipeline.

7. The tank for substrate cleaning according to claim 1, wherein the heat exchange tube is any one of an immerged coiler, a U-tube, and a coil.

8. The tank for substrate cleaning according to claim 1, wherein the heat exchange tube is made of a stainless steel.

9. The tank for substrate cleaning according to claim 1, wherein the heater comprises a sleeve and a heating element inserted in the sleeve, and the sleeve is provided with a plurality of radiating fins.

10. The tank for substrate cleaning according to claim 1, wherein the hot waste gas recycle tube is provided with a fan.

11. A substrate cleaning apparatus, comprising:
the tank for substrate cleaning according to claim 1;
a pump connected with the tank and configured to pump a substrate cleaning fluid in the tank; and
a plurality of nozzles connected with the pump and configured to clean a substrate.

12. A tank heating apparatus, comprising:
a tank for substrate cleaning, applied to a production line, wherein the tank for substrate cleaning comprises: a tank body, a hot waste gas recycle tube, a heater, a heat exchange tube and an exhaust tube, wherein the hot waste gas recycle tube is configured to receive a hot waste gas in a hot waste gas discharge tube of the production line, the heater and the heat exchange tube are configured to heat a fluid in the tank body, one end of the heat exchange tube is communicated with the hot waste gas recycle tube, and the other end of the heat exchange tube is communicated with the exhaust tube;
a temperature sensor, which is arranged in the tank body and configured to detect a temperature of the fluid in the tank body; and
a control device, which is electrically connected with the temperature sensor and configured to control the heater and/or the heat exchange tube to heat in case that the temperature of the fluid in the tank body is lower than a set temperature, and control the heater and the heat exchange tube to stop heating in the case that the temperature of the fluid in the tank body is not lower than the set temperature;
wherein the tank body comprises an inner shell and an outer shell, a thermal insulation cavity is formed between the inner shell and the outer shell, and the thermal insulation cavity is communicated with the hot waste gas recycle tube;
wherein a top of the outer shell is provided with a liquid inlet tube communicated with the thermal insulation cavity, and a bottom of the outer shell is provided with a liquid discharge tube communicated with the thermal insulation cavity;
wherein the outer shell is provided with a gas inlet interface which is communicated with the hot waste gas recycle tube and used to introduce the hot waste gas to the thermal insulation cavity; the outer shell is further provided with an exhaust interface which is communicated with the exhaust tube through a connecting tube and used to discharge the hot waste gas in the thermal insulation cavity;
wherein the hot waste gas recycle tube is a heat-insulated pipeline; the hot waste gas recycle tube is provided with a control valve which is configured to control whether to convey hot waste gas into the heat exchange tube; and
wherein the liquid inlet tube and the liquid discharge tube are respectively provided with valves.

13. A tank heating method for heating a tank for substrate cleaning, wherein the tank for substrate cleaning is used in a production line, and comprises: a tank body, a hot waste gas recycle tube, a heater, a heat exchange tube, and an exhaust tube; the hot waste gas recycle tube is configured to receive a hot waste gas in a hot waste gas discharge tube of the production line, the heater and the heat exchange tube are configured to heat a fluid in the tank body, one end of the heat exchange tube is communicated with the hot waste gas recycle tube, and the other end of the heat exchange tube is communicated with the exhaust tube;
wherein the tank body comprises an inner shell and an outer shell, a thermal insulation cavity is formed between the inner shell and the outer shell, and the thermal insulation cavity is communicated with the hot waste gas recycle tube;
wherein a top of the outer shell is provided with a liquid inlet tube communicated with the thermal insulation cavity, and a bottom of the outer shell is provided with a liquid discharge tube communicated with the thermal insulation cavity;
wherein the outer shell is provided with a gas inlet interface which is communicated with the hot waste gas recycle tube and used to introduce the hot waste gas to the thermal insulation cavity; the outer shell is further provided with an exhaust interface which is communicated with the exhaust tube through a connecting tube and used to discharge the hot waste gas in the thermal insulation cavity;
wherein the hot waste gas recycle tube is a heat-insulated pipeline; the hot waste gas recycle tube is provided with a control valve which is configured to control whether to convey hot waste gas into the heat exchange tube;
wherein the liquid inlet tube and the liquid discharge tube are respectively provided with valves; and
wherein the tank heating method comprises steps of:
detecting a temperature of the fluid in the tank body; and
determining whether the temperature of the fluid in the tank body is lower than a set temperature, controlling the heater and/or the heat exchange tube to heat in case that the temperature of the fluid is lower than the set temperature, and controlling the heater and the heat exchange tube to stop heating in the case that the temperature of the fluid is not lower than the set temperature.

* * * * *